(12) United States Patent
Pavlovic et al.

(10) Patent No.: US 8,885,360 B2
(45) Date of Patent: Nov. 11, 2014

(54) CHARGER ASSEMBLY AND ELECTROMAGNETIC INTERFERENCE SHIELD ASSEMBLY

(75) Inventors: Slobodan Pavlovic, Novi, MI (US); Nadir Sharaf, Bloomfield Township, MI (US); Dilip Daftuar, West Bloomfield, MI (US)

(73) Assignee: Lear Corporation, Southfield, MI (US)

( * ) Notice: Subject to any disclaimer, the term of this patent is extended or adjusted under 35 U.S.C. 154(b) by 316 days.

(21) Appl. No.: 13/307,942

(22) Filed: Nov. 30, 2011

(65) Prior Publication Data

US 2013/0135841 A1  May 30, 2013

(51) Int. Cl.
*H05K 9/00* (2006.01)

(52) U.S. Cl.
USPC ...... 361/818; 361/816; 361/679.01; 174/386; 174/394

(58) Field of Classification Search
CPC ..................................................... H05K 9/005
USPC ............ 361/818, 600, 816; 174/50, 386, 394; 252/500, 512–514, 515.1; 439/607.02, 439/535
See application file for complete search history.

(56) References Cited

U.S. PATENT DOCUMENTS

| | | | |
|---|---|---|---|
| 4,508,640 A * | 4/1985 | Kanda et al. | 252/503 |
| 5,412,024 A * | 5/1995 | Okada et al. | 524/577 |
| 5,422,787 A | 6/1995 | Gourdine | |
| 5,491,892 A | 2/1996 | Fritz et al. | |
| 5,519,169 A | 5/1996 | Garrett et al. | |
| 5,639,989 A * | 6/1997 | Higgins, III | 174/386 |
| 5,740,015 A | 4/1998 | Donegan et al. | |
| 5,831,240 A | 11/1998 | Katooka et al. | |
| 6,069,315 A | 5/2000 | Tang | |
| 6,313,991 B1 | 11/2001 | Nagashima et al. | |
| 6,426,874 B2 | 7/2002 | Kajiura | |
| 6,733,345 B2 | 5/2004 | Weise et al. | |
| 6,839,240 B2 | 1/2005 | Skofljanec et al. | |
| 7,013,558 B2 | 3/2006 | Bachman | |
| 7,050,305 B2 | 5/2006 | Thorum | |
| 7,450,388 B2 * | 11/2008 | Beihoff et al. | 361/715 |
| 7,479,020 B2 | 1/2009 | Whitton | |
| 7,488,901 B2 * | 2/2009 | Arnold | 174/377 |
| 7,660,099 B2 | 2/2010 | Imamura et al. | |
| 7,726,440 B2 | 6/2010 | Aisenbrey | |
| 7,788,801 B2 | 9/2010 | Oggioni et al. | |

(Continued)

FOREIGN PATENT DOCUMENTS

| | | |
|---|---|---|
| JP | 2005093515 A | 4/2005 |
| WO | 2010144399 A2 | 12/2010 |

OTHER PUBLICATIONS

CurrentWays.com, "BC-Series 3kW 112-450 Volts IP67 Rated Liquid-Cooled EV Battery Charger", currentways Technologies, Oct. 20, 2011, 4 pages.

(Continued)

*Primary Examiner* — Robert J Hoffberg
*Assistant Examiner* — Mukund G Patel
(74) *Attorney, Agent, or Firm* — Brooks Kushman P.C.

(57) ABSTRACT

An electromagnetic interference shield assembly is provided with a first housing formed of a first conductive polymer. The first housing has a cavity sized to receive an electronic subassembly therein. A second housing is formed of a second conductive polymer. The second housing has a cavity sized to receive the first housing therein.

8 Claims, 6 Drawing Sheets

(56) References Cited

U.S. PATENT DOCUMENTS

| | | |
|---|---|---|
| 7,804,688 B2 | 9/2010 | Wakabayashi et al. |
| 7,817,431 B2 | 10/2010 | Baker |
| 7,911,806 B2 * | 3/2011 | Funato et al. ............ 361/818 |
| 8,040,005 B2 | 10/2011 | Bhatti |
| 8,471,145 B2 | 6/2013 | Suzuki |
| 2003/0175454 A1 * | 9/2003 | Lichtenstein et al. ....... 428/35.7 |
| 2003/0221849 A1 * | 12/2003 | Pommerenke et al. .. 174/35 GC |
| 2007/0240867 A1 | 10/2007 | Amano et al. |
| 2007/0246191 A1 | 10/2007 | Behrens et al. |
| 2007/0247817 A1 | 10/2007 | Huang |
| 2010/0014243 A1 | 1/2010 | Tsai et al. |
| 2011/0214629 A1 | 9/2011 | Benoit |
| 2011/0235276 A1 | 9/2011 | Hentschel et al. |
| 2012/0100414 A1 * | 4/2012 | Sonta ............ 429/163 |

OTHER PUBLICATIONS www.delphi.com, "Delphi Universal On-board Battery Charger", Hybrid/Electrical Vehicle Products, Oct. 1, 2011, 1 page.

www.TDIPOWER.com, "Liquid Cooled Power Solutions for Electric & Hybrid Vehicles", TDI Power, 2008, 6 pages.

U.S. Appl. No. 13/307,950, "Housing Assembly to Enclose and Ground an Electrical Subassembly", filed Nov. 30, 2011, 26 pages.

U.S. Appl. No. 13/307,222, "Charger Assembly With Heat Transfer Duct", filed Nov. 30, 2011, 16 pages.

\* cited by examiner

CHARGER ASSEMBLY AND ELECTROMAGNETIC INTERFERENCE SHIELD ASSEMBLY

TECHNICAL FIELD

Various embodiments relate to a charger assembly and an electromagnetic interference shield assembly.

BACKGROUND

In the advent of electric vehicles, hybrid electric vehicles, and any battery-powered vehicle, charger assemblies have been incorporated for charging the battery or batteries. Such charger assemblies often experience high voltages and are often utilized for converting alternating current to direct current. This conversion results in a high heat output and transmission of electromagnetic interference.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
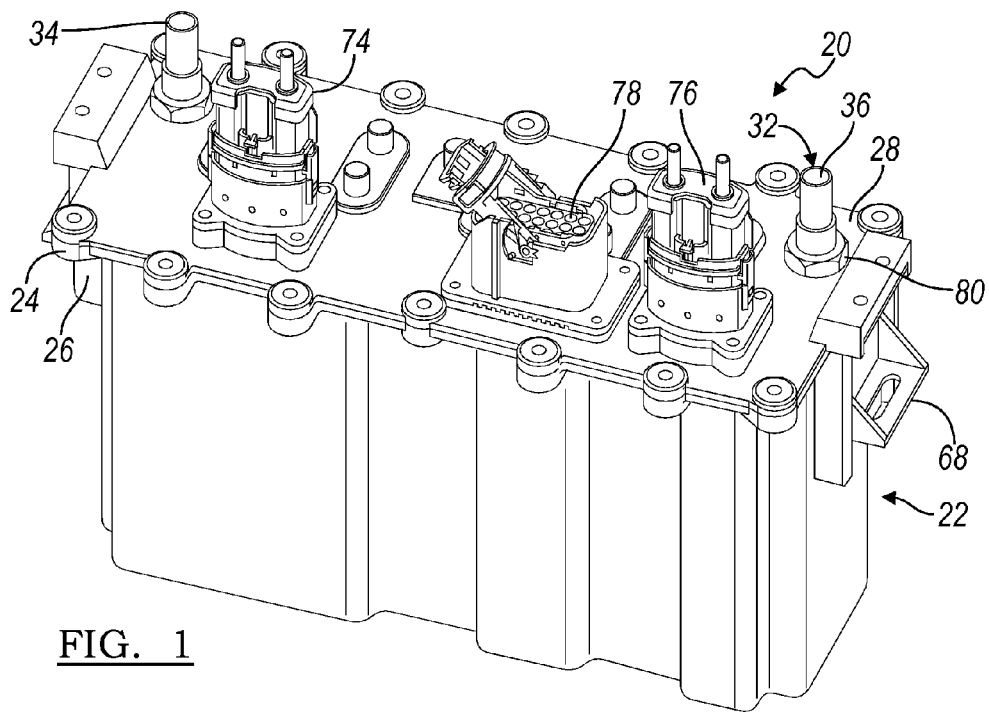
FIG. 1 is a perspective view of a charger assembly according to an embodiment.
Figure 2:
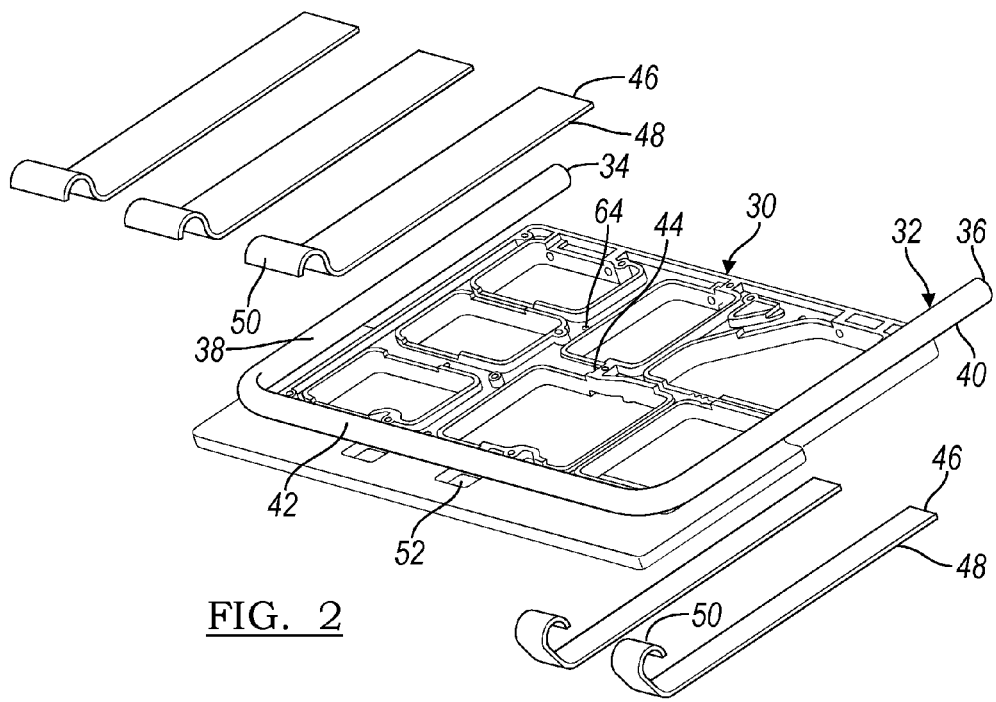
FIG. 2 is an exploded perspective view of heat transfer components of the charger assembly of FIG. 1.

Referring now to FIG. 1, a charger assembly is illustrated and referenced generally by numeral 20. The charger assembly 20, according to an embodiment, is an onboard charger, which is mounted to a vehicle body for charging a battery or batteries of the vehicle. Therefore, the size, shape, weight, rate of heat transfer, electromagnetic interference, durability and cost are all factors for the charger assembly 20 and the associated vehicle.

In the depicted embodiment, the charger assembly 20 has a housing 22. The housing 22 is generally hollow with a cavity therein for receiving components of the assembly 20. For the depicted embodiment, the housing 22 is formed from a conductive polymeric material. The housing 22 has an opening 24 for receiving components of the assembly 20 within the cavity. A mounting surface 26 is provided about the opening 24 for receiving a cover 28 fastened to the mounting surface 26.

Figure 3:
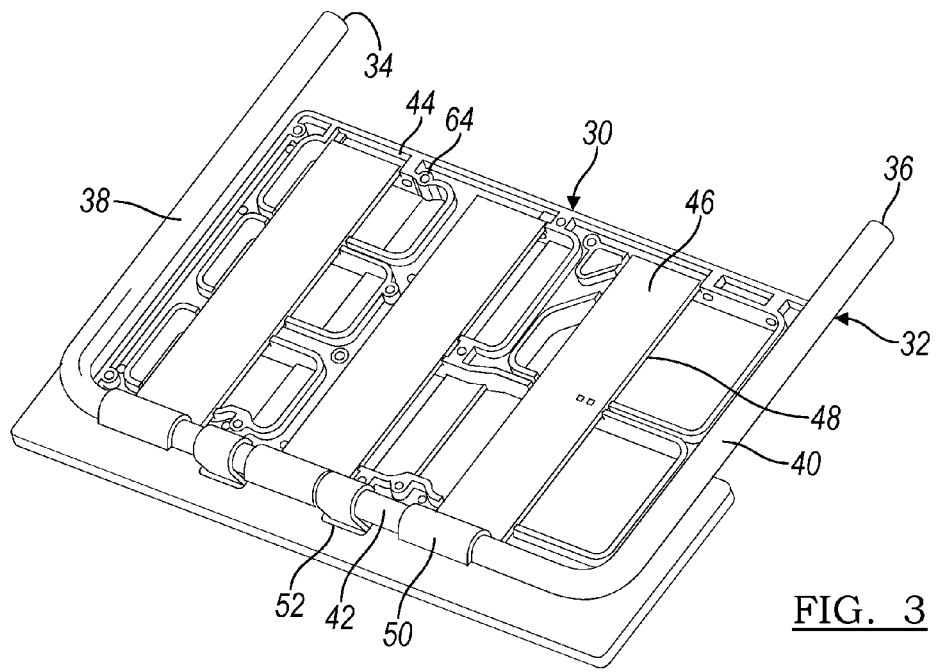
FIG. 3 is a perspective view of the heat transfer components of FIG. 2, illustrated assembled.

Referring now to FIG. 3, the charger assembly 20 includes a substrate 30. The substrate 30 may be formed of any suitable material such as plastic, aluminum, or the like. The substrate 30 is mounted to the cover 28 for being disposed within the cavity of the housing 22.

A heat transfer duct 32 is provided by a continuous bent piece of round tubing 32 for conveying fluid such as water or a coolant through the charger assembly 20. The tubing 32 has a pair of ends 34, 36 that extends through the cover 28 to provide an inlet and an outlet for the heat transfer duct 32. The tubing 32 extends straight in a depth direction from each of the ends 34, 36 for providing a pair of straight regions 38, 40 as inlet and outlet regions 38, 40. An intermediate region 42 extends between the straight regions 38, 40. The tubing 32 is formed from a solid piece to avoid any fittings or connections within the charger assembly 20. The tubing 32 is placed upon the substrate 30. Of course, any pattern of the tubing 32 is contemplated.

The substrate 30 has a plurality of recesses 44 formed therein. The recesses 44 are aligned with high heat zones of associated circuit board assemblies. The recesses 44 are sized to receive a plurality of thermally conductive heat sinks 46. The heat sinks 46 may be formed from a thermally conductive material, such as copper, aluminum, heat pipe, or the like. Each heat sink 46 has a generally planar contact portion 48 for contact with the associated circuit board assembly. Each heat sink 46 also includes an arcuate, or curved, contact portion 50 that is contoured to the shape of the tubing 32 for an area contact with the tubing 32. The heat sinks 46 are not fastened to the substrate 30. The heat sinks 46 are placed within the recesses 44 upon the substrate 30 as illustrated in FIG. 3. Since the tubing 32 is displaced along one side of the substrate 30, the heat sinks 46 on the opposed side extend through apertures 52 so that the curved contact portions 50 engage the tubing 32.

Figure 4:
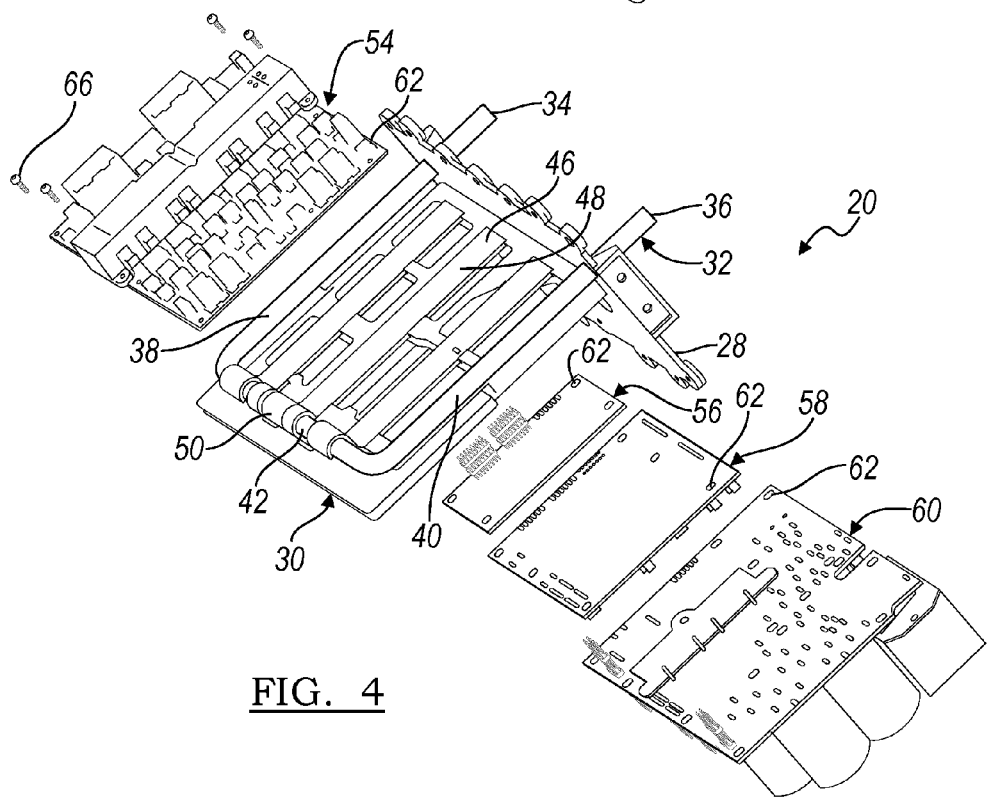
FIG. 4 is an exploded perspective view of the assembled heat transfer components of FIG. 3 and circuit board assemblies.

Referring now to FIG. 4, the cover 28 is assembled to the substrate 30 and the tubing 32. Also, a plurality of circuit board assemblies 54, 56, 58, 60 is assembled to both sides of the substrate 30. The circuit board assemblies 54, 56, 58, 60 each include an aperture pattern 62 that collectively corresponds with an aperture pattern 64 of the substrate 30 for receipt of fasteners 66 for assembling the circuit board assemblies 54, 56, 58, 60 to the substrate 30. By fastening the circuit board assemblies 54, 56, 58, 60 to the substrate 30, the heat sinks 46 are retained between each corresponding circuit board assembly 54, 56, 58, 60 and the substrate 30. The heat sinks 46 are aligned with high heat zones of the associated circuit board assemblies 54, 56, 58, 60 to transfer the heat from the circuit board assemblies 54, 56, 58, 60 to the tubing 32. By conveying a fluid through the tubing 32, the heat is transferred from the heat sinks 46 to the tubing 32, and consequently to the fluid within the tubing 32 for transferring the heat out of the charger assembly 20.

Although various circuit board assemblies 54, 56, 58, 60 are contemplated, the circuit board assemblies 54, 56, 58, 60 may each be provided on a printed circuit board. The circuit board assemblies 54, 56, 58, 60 may include power, control, and power factor correction. Of course, various circuit board assemblies are contemplated.

Figure 5:
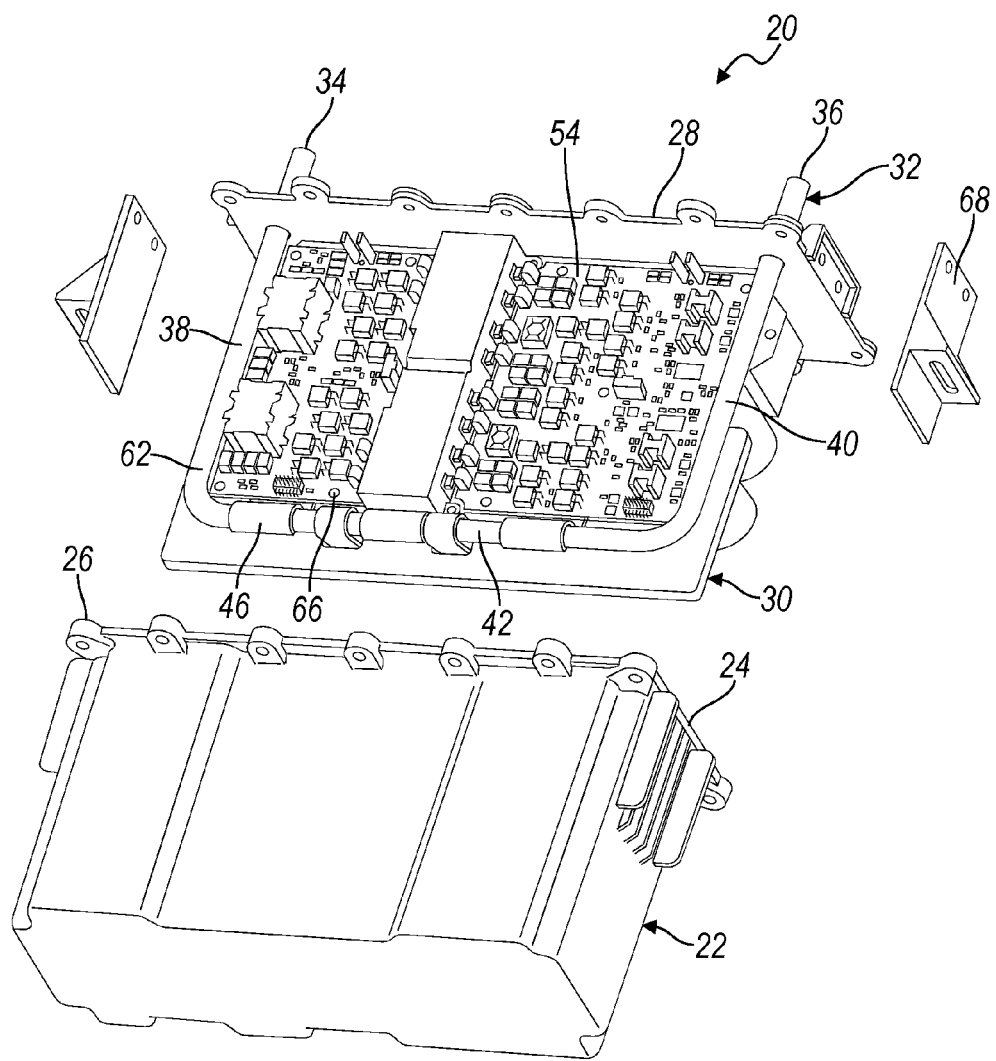
FIG. 5 is an exploded perspective view of the charger assembly of FIG. 1.

With reference now to FIG. 5, all of the components of the charger assembly 20 are assembled prior to being inserted into the housing 22. Thus, assembly of the components can occur at a location that is external of the housing 22. Therefore, accessibility to the various components is enhanced. Likewise, assembly does not occur within the housing 22 itself. In the depicted embodiment, the housing 22 has only one opening. The simplification is an enhancement over prior art charger assemblies that have various access openings and therefore various covers for access, assembly, and enclosing various components of the prior art charger assembly.

Figure 6:
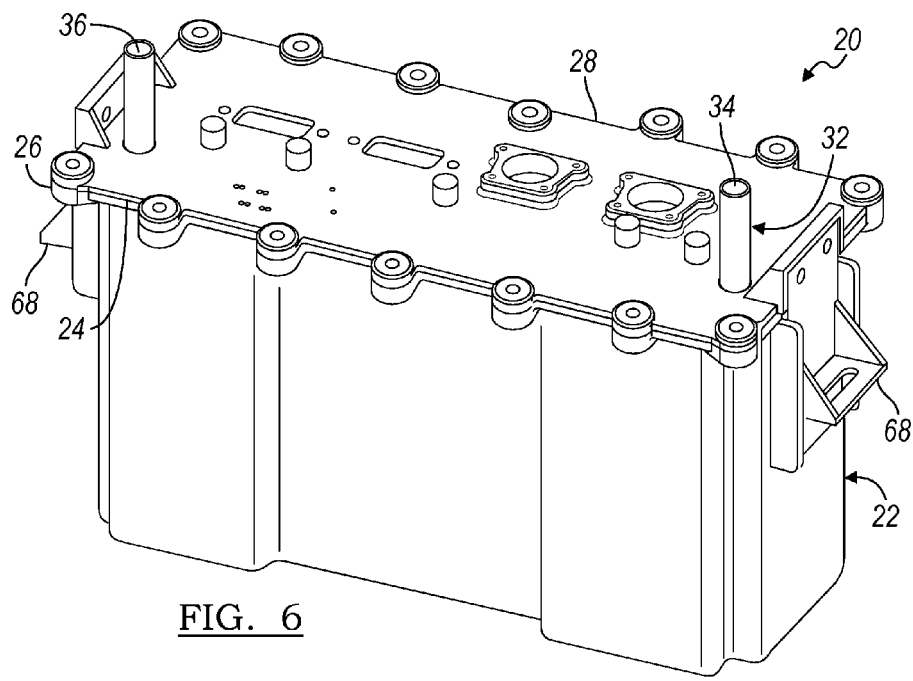
FIG. 6 is a perspective view of the charger assembly of FIG. 1, illustrated partially assembled.
Figure 7:
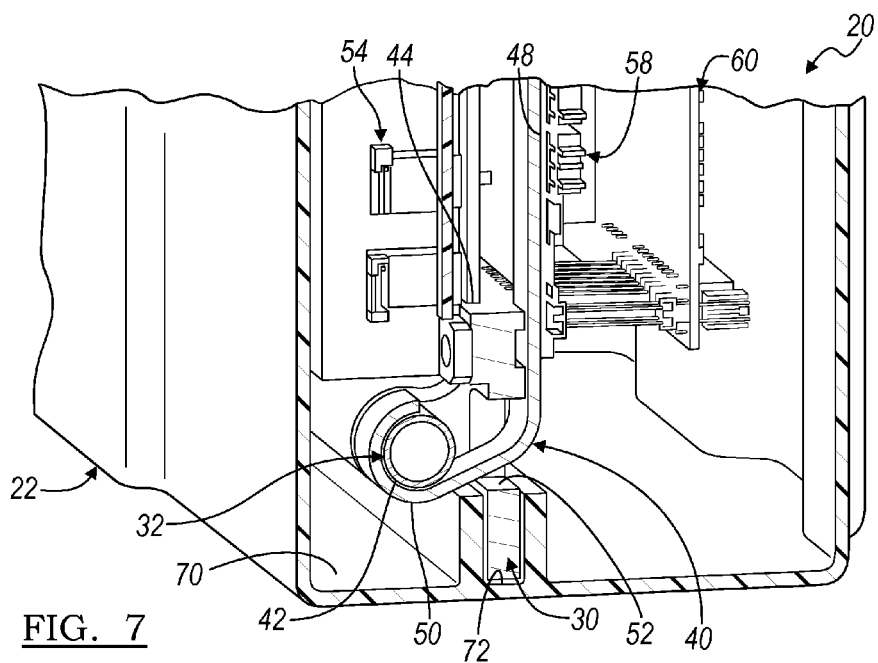
FIG. 7 is a section view of the charger assembly of FIG. 1.

FIG. 5 also illustrates a pair of mounting brackets 68 that are fastened to the cover 28 for supporting and fastening the charger assembly 20 to an underlying support structure, such as the vehicle body. The assembled cover 28, mounting brackets 68 and housing 22 are illustrated in FIG. 6. FIG. 7 illustrates a cross section of the charger assembly 20. The housing 22 includes a cavity 70 for receiving the components assembled to the cover 28. A channel 72 is formed within a bottom surface of the housing 22 for receiving a proximal end of the substrate 30.

Referring again to FIG. 1, a plurality of connectors is assembled to the cover 28 in electrical connection with the circuit board assemblies 54, 56, 58, 60. For example, two power connectors 74, 76 and one signal connectors 78 may be fastened to the cover 28. Additionally, fittings 80 may be provided on the tubing ends 34, 36 external of the housing 22.

As discussed above, the housing 22 may be provided from a conductive plastic material. The conductive plastic material may be utilized for shielding electromagnetic interference (EMI) and/or grounding of the charger assembly 20. Likewise, the relative flexibility of the housing 22 provides a sealed connection with the cover 28 so that an additional seal is not required in order to seal the components of the charger assembly 20 from external contaminants.

The packaging of the housing 22 permits simplified alignment and structure with all connections oriented in a common direction for accessibility, ease in assembly, and minimizing wiring, and permitting utilization of the housing 22 with only one opening 24.

Prior art charger assemblies often utilize a cast aluminum housing with multiple openings requiring multiple covers. Due to the inflexibility of cast aluminum, seals are required, which are less reliable than the connection provided by fastening the cover 28 to the mounting surface 26 of the housing 22. Therefore, leakage is reduced with the plastic housing 22, while weight is also reduced. For example, the depicted charger assembly 20 weighs generally 5 kilograms wherein the prior art charger assembly weighs approximately 7 kilograms. Additionally, a molded conductive plastic housing is cheaper in materials and manufacturing than a cast aluminum housing.

By utilization of the heat sinks 46, the heat can be conducted directly from the heat source to the tubing 32 thereby avoiding complicated tubing paths and geometries. By retaining the heat sinks 46 between the circuit board assemblies 54, 56, 58, 60 and the substrate 30, additional fasteners can be avoided.

Figure 8:
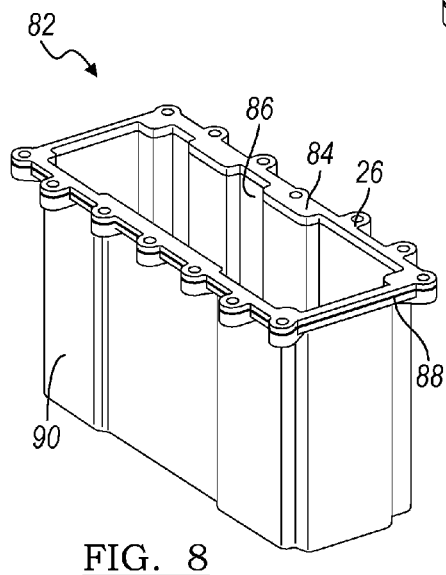
FIG. 8 is a perspective view of an electromagnetic interference (EMI) shield assembly of the charger assembly of FIG. 1.
Figure 9:
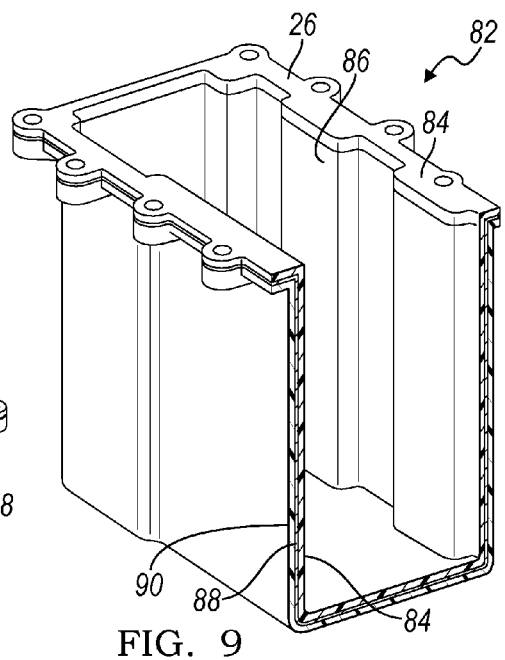
FIG. 9 is a fragmentary perspective view of the EMI shield assembly of FIG. 8.
Figure 10:
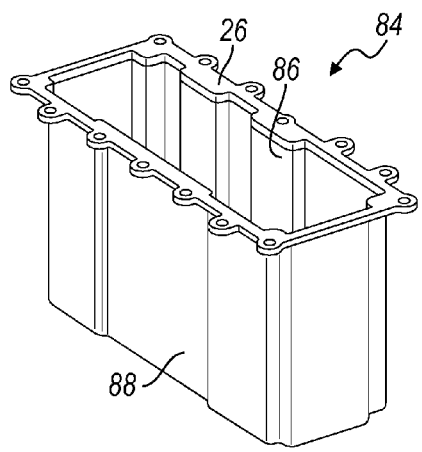
FIG. 10 is a perspective view of a first housing of the EMI shield assembly of FIG. 8.

FIGS. 8 and 9 illustrate an EMI shield assembly 82 which can be utilized as the housing 22 according to at least one embodiment. The EMI shield assembly 82 includes a first housing 84 having a cavity 86 for receiving an electronic sub-assembly, such as the charger assembly 20, therein. The first housing 84 provides the mounting surface 26 for the cover 28. The first housing 84 is also illustrated in FIG. 10. The first housing 84 is formed from a conductive polymer, such as a polyamide 66 or PA66 with ten percent Nickel Coated Carbon fiber, for example. The first housing 84 has a wall thickness of approximately one millimeter according to at least one embodiment.

A metallic layer 88 is provided about the first housing 84. According to one embodiment, the first housing is coated with the metallic layer 88. The metallic layer 88 may be provided by aluminum foil according to at least one embodiment, or by a steel box according to at least another embodiment. The first housing 84 shields against high frequency EMI, such as a range of 20 to 1.73 MHertz.

Figure 11:
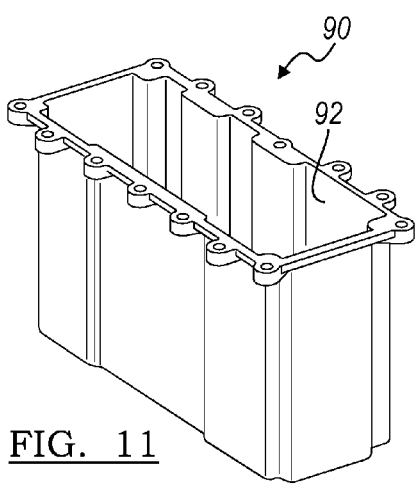
FIG. 11 is a perspective view of a second housing of the EMI shield assembly of FIG. 8.

The EMI shield assembly 82 also includes a second housing 90 with a cavity 92 for receiving the first housing 84 and the metallic layer 88 within the second housing cavity 92. The second housing is also illustrated in FIG. 11. Alternatively, the metallic layer 88 could be provided in the cavity 92 of the second housing 90 instead of being provided about the first housing 84.

The second housing 90 is formed from a conductive polymer, such as a polyamide 66 with thirty percent Stainless Steel fiber according to at least one embodiment. The second housing 90 shields against low frequency EMI within a range of twenty-five to one hundred Hertz. The second housing 90 has a wall thickness of approximately two millimeters according to at least one embodiment.

The EMI shield assembly 82 utilizes conductive polymers for enclosing high voltage electronic sub-assemblies, instead of aluminum, as in the prior art. The conductive polymers permit grounding of the housings 84, 90 while shielding a wide range of EMI from exiting, or entering the housings 84, 90. The EMI shield assembly 82 utilizes the housings 84, 90 with materials having different shielding properties over defined frequency ranges to meet full range shielding efficiency requirements for a given application. The metallic layer 88 further enhances the shielding effectiveness of the first housing 84 for preventing EMI of the charger assembly 20 from interfering with other components located near the charger assembly 20 while preventing EMI from other components from interfering with the charger assembly 20.

The housings 84, 90 collectively provide a high structural strength to meet applicable crush test stresses and stiffness requirements. The multiple polymer layers provided by the housings 84, 90 provide insulation of the charger assembly 20 from high temperatures that may be present in an environment under a hood of the vehicle. Additional thermal insulation may be provided between the housings 84, 90 according to at least one embodiment. The EMI shielding assembly 82 provides the housing 22 for the charger at a compact size, such as approximately 313 millimeters by 122 millimeters by 199 millimeters.

Figure 12:
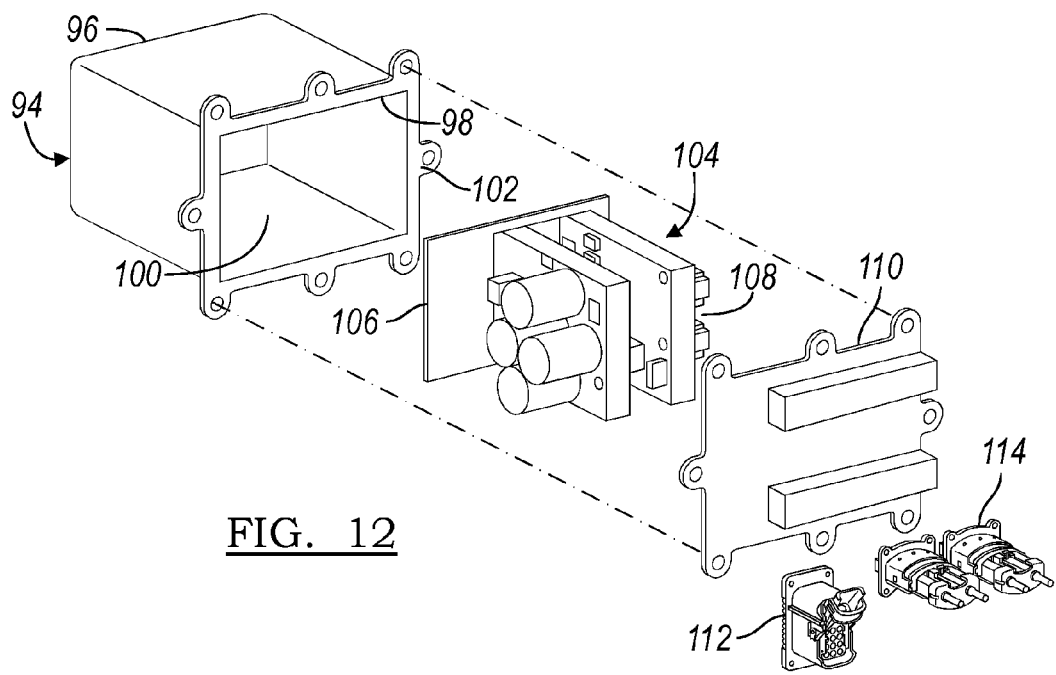
FIG. 12 is an exploded perspective view of another electronic assembly with an EMI shield assembly according to another embodiment.
Figure 13:
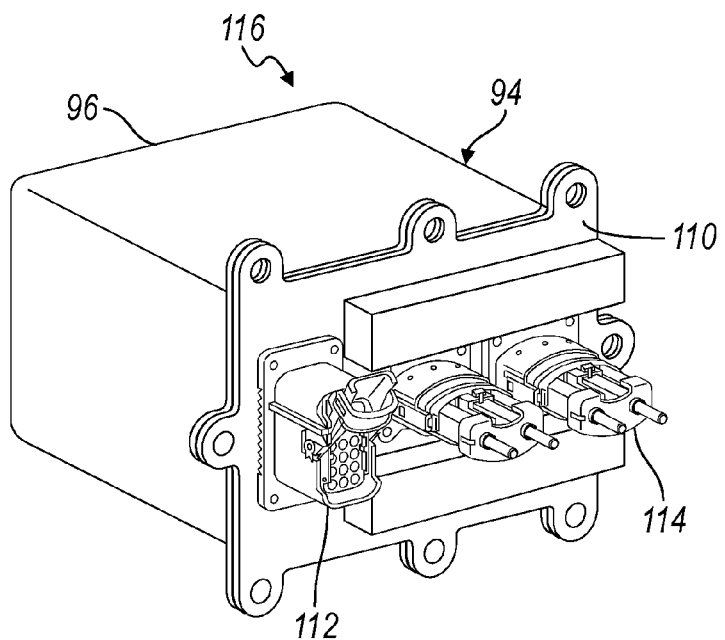
FIG. 13 is a perspective view of the electronic assembly of FIG. 12.

Of course, the EMI shielding assembly 82 may be utilized for various electronic subassemblies. FIGS. 12 and 13 illustrate another EMI shielding assembly 94 with a dual conductive plastic housing assembly 96 similar to the prior embodiment. The housings 96 provide a cavity 98 at an opening 100 with a mounting surface 102. A 3D card 104 with a printed circuit board 106 connected at a back plane with heat pipes 108 is disposed within the cavity 98 and enclosed by a cover 110 fastened to the mounting surface 102. A control fitting 112 and power fittings 114 are subsequently added to the cover 110. This assembly 82 permits a compact 3D PCB assembly 116 that is compact and optimizes strength, insulation, EMI shielding, and heat transfer. For example the EMI shield assembly 94 may be approximately 180 millimeters by 125 millimeters by 193 millimeters.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electronic assembly comprising:
   a first housing formed of a first conductive polymer, the first housing having a cavity;
   a second housing formed of a second conductive polymer, the second housing having a cavity sized to receive the first housing therein; and
   an electronic subassembly disposed within the cavity of the first housing;
   wherein the electronic subassembly comprises a high voltage charger to convert alternating current to direct current to charge an automotive battery;
   wherein the first housing and the second housing provide an electromagnetic interference (EMI) shield assembly;
   wherein the first housing is formed of polyamide 66 with ten percent Carbon Nickel fiber to shield against high frequency EMI;
   wherein the second housing is formed of polyamide 66 with thirty percent Stainless Steel fiber to shield against low frequency EMI; and
   wherein the EMI shield assembly further comprises a metallic layer disposed between the first housing and the second housing.

2. The electronic assembly of claim 1 wherein the metallic layer is coated upon one of an exterior of the first housing and an interior of the second housing.

3. The electronic assembly of claim 1 wherein the metallic layer is coated upon an exterior of the first housing.

4. The electronic assembly of claim 1 wherein the metallic layer comprises aluminum foil.

5. The electronic assembly of claim 1 wherein the metallic layer comprises a steel housing.

6. The electronic assembly of claim 1 wherein the first housing shields against EMI within a range of 20 Hertz to 1.73 MHertz.

7. The electronic assembly of claim 1 wherein the second housing shields against EMI within a range of twenty to one hundred Hertz.

8. The electronic assembly of claim 1 wherein the first housing has a wall thickness of approximately one millimeter.

* * * * *